United States Patent [19]

George

[11] 4,091,458
[45] May 23, 1978

[54] MULTIPLE CHEVRON PASSIVE GENERATOR

[75] Inventor: Peter K. George, Placentia, Calif.

[73] Assignee: Rockwell International Corporation, El Segundo, Calif.

[21] Appl. No.: 696,016

[22] Filed: Jun. 14, 1976

[51] Int. Cl.² .............................................. G11C 19/08
[52] U.S. Cl. .................................................... 365/12
[58] Field of Search .................................. 340/174 TF

[56] References Cited

U.S. PATENT DOCUMENTS

| 3,555,527 | 1/1971 | Perneski | 340/174 TF |
| 3,713,118 | 1/1973 | Danylchuk | 340/174 TF |
| 3,868,661 | 2/1975 | Bonyhard et al. | 340/174 TF |

Primary Examiner—James W. Moffitt
Attorney, Agent, or Firm—H. Frederick Hamann; G. Donald Weber, Jr.

[57] ABSTRACT

There is described a bubble domain field access device component for providing continuous generation of a stream of bubble domains. The device is in the nature of a passive generator which is preferably constructed using one-level processing. The device uses multiple chevrons (chevron columns) which have the advantages of inherent redundancy, reduced gap tolerances and wide propagation margin. The structure comprises, generally, a rectangular seed plate arranged as a 90°, multiple-chevron, corner portion.

7 Claims, 6 Drawing Figures

MULTIPLE CHEVRON PASSIVE GENERATOR

BACKGROUND

1. Field of the Invention

This invention relates to magnetic bubble domain devices, in general, and to a multiple-chevron, passive generator device in particular.

2. Prior Art

There are many known devices which are utilized to generate, propagate and otherwise manipulate magnetic bubble domains. Many of these devices use similar magnetizable structures on a magnetic bubble domain material. However, the specific arrangements of the devices frequently provides a new and novel component which satisfies a need in magnetic bubble domain device structures.

There are many prior art devices which use chevron structures or columns for propagating magnetic bubbles throughout various chip arrangements. The prior art utilizing chevron structures is too numerous to reference here. In addition, there are known configurations for magnetic bubble domain generators in the art. Some of these known generators are passive and many (if not most) are active. That is, active generators require a signal current to selectively produce magnetic bubbles while passive generators do not. Examples of known generators are shown and described in "Characterization of Magnetic Bubble Generators" IEEE Trans. on Magn. MAG-10, pp 23–27, March, 1974, and "Field Nucleation of Magnetic Bubbles" IEEE Trans. on Magn. MAG-9, pp 289–293, September, 1973. Also, reference is made to U.S. Pat. Nos. 3,824,565; 3,925,769; 3,924,249. These references represent the most pertinent prior art known at this time.

SUMMARY OF THE INVENTION

In the multiple-chevron, passive generator of the instant invention, a rectangular seed plate is interposed between columns of chevron structures. The seed plate is arranged to form a 90° corner with the chevron structures. The rectangular seed plate includes a small protrusion such that the chevron stacks or columns and the seed plate interact to passively generate bubbles for propagation along the chevron path in response to the rotational magnetic field applied to the device.

DESCRIPTION OF THE PREFERRED EMBODIMENT

Figure 1:
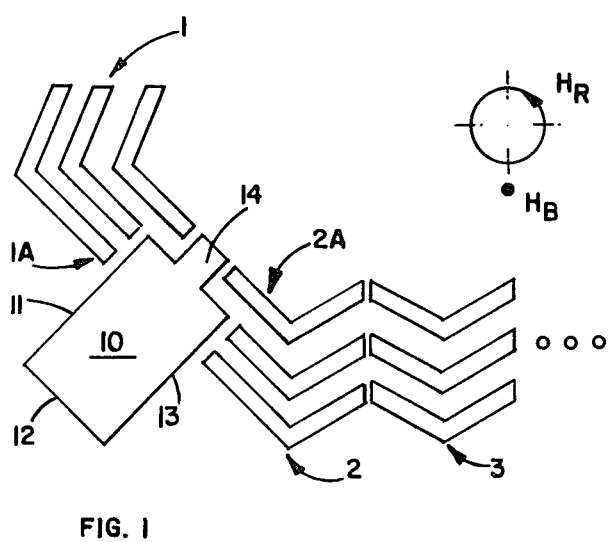
FIG. 1 is a diagramatic representation of the multiple-chevron, passive generator of the instant invention.

Referring now to FIG. 1, there is shown a diagramatic representation of the multiple-chevron, passive generator of the instant invention. The rectangular seed plate 10 is provided. Typically, this seed plate may be fabricated of some suitable ferromagnetic material such as permalloy or the like. However, other suitable materials may be known to those skilled in the art. The rectangular seed plate 10 includes sides 11, 12 and 13 as well as a fourth side which has protrusion 14 extending therefrom. A first column 1 of chevrons is disposed adjacent side 11 of seed plate 10. At least one of the chevrons has a somewhat elongated leg which extends beyond side 11 (projected) and into proximity with projection 14. The ends 1A of the chevrons in column 1 provide magnetic coupling between column 1 and seed plate 10.

Column 2 of chevrons is disposed adjacent to side 13 of seed plate 10. Again, one of the chevrons in column 2 has a somewhat elongated leg which extends beyond side 13 (projected) and into proximity with projection 14 of seed plate 10. The magnetic coupling between seed plate 10 and the chevrons of column 2 is accomplished at chevron ends 2A.

The other ends of the chevrons of column 2 are disposed adjacent the ends of column 3 of chevrons which are then magnetically coupled to other chevron columns (or similar devices) which form a suitable propagation path which does not form a part of this invention, per se.

Referring now to FIGS. 2a–2d, it is assumed that a counterclockwise rotating field, $H_R$, is applied to the plane of the generator of this invention. Also, it is assumed that a bias field, $H_B$, is applied normal to the plane of the invention. The fields $H_B$ and $H_R$ are chosen to establish a seed bubble at the seed plate 10. The seed bubble rotates around the periphery of seed plate 10 in a counterclockwise direction in response to field $H_R$. It should be noted that the bubble which propagates around the periphery of seed plate 10 is propagating in the opposite direction to the bubbles which are (or will be) propagating through the propagation path.

Figure 2A:
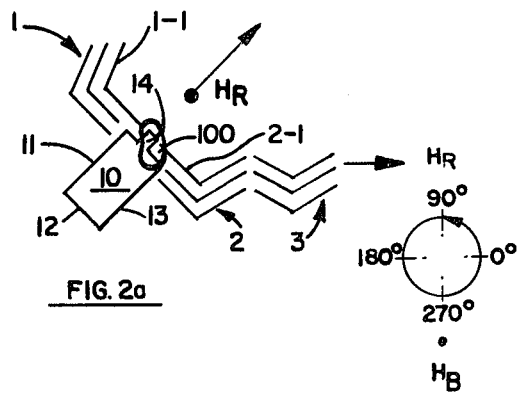
FIGS. 2a–2d are diagramatic representations of the generator shown in FIG. 1 with the magnetic bubble domain shown therein.

In FIG. 2a, the rotating field $H_R$ assumes a position roughly equivalent to a 45° position as suggested by the rotational field legend. In response to this position of the rotating field $H_R$, magnetic poles are produced at the edges and side of plate 10 which are adjacent to projection 14. At this time, there is little or no interaction between seed plate 10 and any of the chevron columns because of the poles (or lack thereof) produced by the rotating field.

Figure 2B:
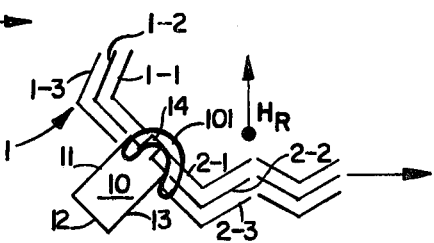

Referring to FIG. 2b, the rotating field $H_R$ is rotated to the position which approximates the 90° position. This field produces magnetic poles at the upper corners of the projection 14 and the side 11 of seed plate 10. In addition, a weak pole is beginning to form at the ends 2A of chevrons 2-1, 2-2 and 2-3 in column 2 of chevrons. Because of the proximity of chevron 2-1 to projection 14, bubble 101 begins to stretch from the edges 2A of column 2 chevrons around the projection 14 toward the corner of side 11 of seed plate 10.

Figure 2C:
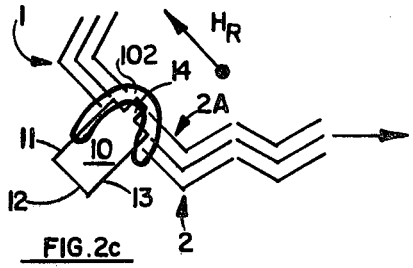

With the further rotation of field $H_R$ to the 135° position suggested by FIG. 2C, bubble 102 is stretched from the edges 2A of the chevrons in column 2 at which ends strong magnetic poles are formed. Likewise, a relatively strong pole is formed at the edge 11 of seed plate 10.

Figure 2D:
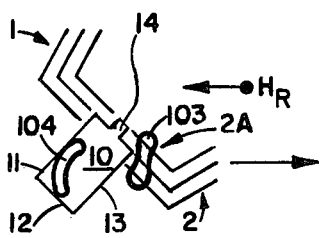

Referring to FIG. 2d, rotating field $H_R$ continues to rotate to the 180° position, thereby establishing a strong magnetic field at the corner of edges or sides 11 and 12 of seed plate 10. In addition, strong poles are obtained at the edges 2A of the chevrons in column 2. One end of the bubble is retained at the edges of the chevrons while the other end of the bubble moves to the corner defined by edges 11 and 12 (around projection 14). Consequently, bubbles 103 and 104 are formed due to the negative pole formed in the vicinity of the projection 14. As field $H_R$ continues to rotate, bubble 103 will propagate along the chevrons in column 2 to the chevrons in column 3 and so forth. In addition, bubble 104 will now act as the seed bubble and propagate around the periphery of seed plate 10. As bubble 104 propagates around the periphery of seed plate 10, in response to rotating field $H_R$, the process described beginning at FIG. 2a will be repeated and a continuous stream of bubbles will be passed along the propagation path comprising chevron columns 2, 3 and so forth.

This generator is unique in that the margin provided therefor (and described infra) extends extremely low in the bias field. It is found that this generator will provide a stretched bubble which will not strip out and separate into a plurality of bubbles at low bias. Typically, a generator of this type has a poor lower bias margin because the bubble strip fails to cut and a strip helix is formed which eventually strips out. Consequently, this generator provides a unique, unexpected operation.

Figure 3:
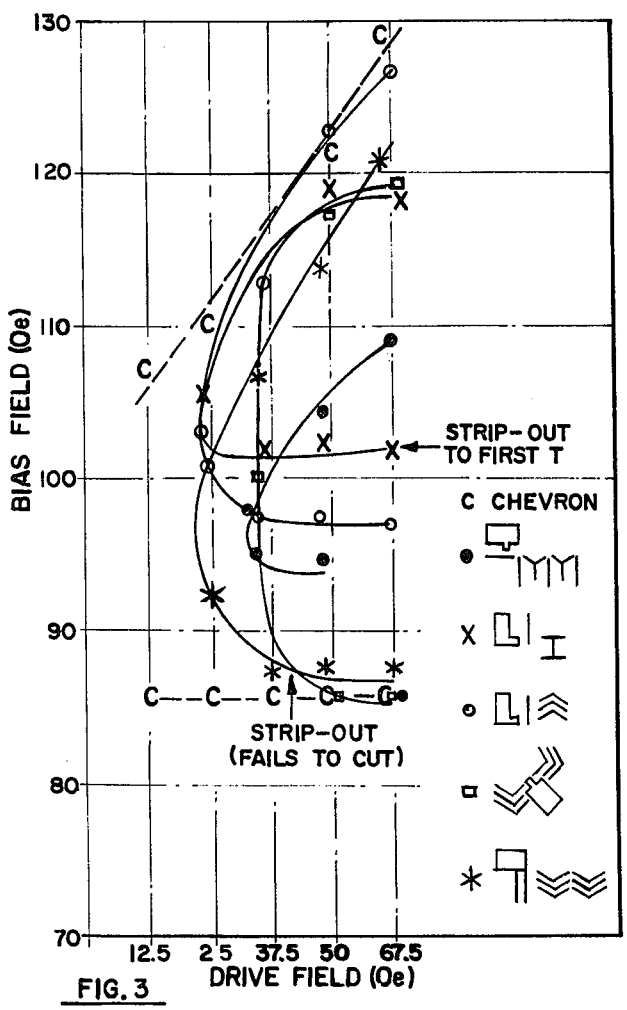
FIG. 3 is a diagram which shows the margin of the device of the instant invention relative to devices known in the prior art.

In FIG. 3 there is shown a diagram of the margin for this generator. The margin is compared to margin characteristics for similar devices known in the art. In particular, the margins for this device indicate that the device field above 37.5 Oe is nearly identical with that for the chevron propagation element itself. Due to the fact that the chevron propagates at lower bias than, for example, a T-bar, this is indicative of a wide operating margin. It is believed that this is due to the presence of the chevrons surrounding the rectangle which prevents the strip out at low bias.

The results shown in the diagram of FIG. 3 suggest that a relatively high drive field is required to initiate replication of the bubbles. However, it is believed that this can be overcome or reduced by decreasing the permalloy-to-garnet spacing or increasing the aspect ratio of the rectangle. However, even the requirements for the drive field as shown in FIG. 3 are not overly high in some applications of the device. Moreover, experimental results have shown that the margins for 150 KHz propagation are nearly identical to those for the quasi-static propagation for the curve shown in FIG. 3.

Thus, there has been shown and described a preferred embodiment of a multiple chevron passive generator device which can be used with magnetic bubble domains and systems utilizing same. The preferred embodiment description has shown and described a specific example of the generator and specific operational characteristics obtainable therewith. It is understood that this description is not intended to be limitative of the invention. Those skilled in the art may contemplate modifications to the device shown without departing from the principle thereof. Consequently, any modifications of this type are intended to be included within this description. The scope of the invention is intended to be covered by the claims appended hereto.

Having thus described the preferred embodiment of the invention, what is claimed is:

1. A passive magnetic bubble domain generator comprising,
    a first pattern of propagation members,
    a second pattern of propagation members,
    said first and second patterns of propagation members each comprise a plurality of chevrons,
    a substantially rectangular pattern of magnetizable material interposed between said first and second patterns of propagation members to provide coupling between said rectangular pattern and said first and second patterns of propagation members in response to applied magnetic fields, and
    a projected pattern portion extending from said substantially rectangular pattern for affecting said coupling by establishing a magnetic pole which severs a magnetic bubble domain stretched across said projected pattern portion in response to said applied magnetic fields,
    at least one chevron in each of said first and second patterns having juxtaposed leg portions thereof substantially co-linear with each other and with the end of said projected pattern portion.

2. The generator recited in claim 1 wherein
    said at least one chevron in each of said first and second patterns having elongated legs which extend beyond the sides of said substantially rectangular pattern into juxtaposition to said projected pattern portion.

3. The generator recited in claim 1 wherein
    said projected pattern portion extends from the approximate center of one side of said substantially rectangular pattern.

4. The generator recited in claim 1 wherein
    said substantially rectangular pattern and said projected pattern portion extending therefrom are a unitary element.

5. The generator recited in claim 4 wherein
    said unitary element supports a seed bubble domain which rotates around the periphery thereof and which is coupled to the ends of said first and second pattern of propagation members.

6. The generator recited in claim 1 wherein
    one portion of a severed magnetic bubble domain is retained at said rectangular pattern as a seed bubble and another portion of a severed magnetic bubble domain is propagated to one of said first and second patterns of propagation members.

7. The generator recited in claim 1 wherein
    said projected pattern portion is rectilinear in configuration.

* * * * *